United States Patent [19]
Shimizu

[11] Patent Number: 6,074,513
[45] Date of Patent: Jun. 13, 2000

[54] ETCHING APPARATUS AND METHOD FOR MANUFACTURING OPTICAL DEVICES

[75] Inventor: Sumito Shimizu, Yokohama, Japan

[73] Assignee: Nikon Corporation, Tokyo, Japan

[21] Appl. No.: 08/994,333

[22] Filed: Dec. 19, 1997

[30] Foreign Application Priority Data

| Dec. 19, 1996 | [JP] | Japan | 8-339422 |
| Jun. 3, 1997 | [JP] | Japan | 9-144801 |
| Jun. 6, 1997 | [JP] | Japan | 9-149702 |

[51] Int. Cl.$^7$ ............................... C23F 1/02
[52] U.S. Cl. ............................... 156/345
[58] Field of Search ............................... 136/345

[56] References Cited

FOREIGN PATENT DOCUMENTS

| 63-221627 | 9/1988 | Japan | 156/345 L |
| 3-12915 | 1/1991 | Japan | H01L 21/027 |
| 3-125421 | 5/1991 | Japan | H01L 21/027 |
| 5-86487 | 4/1993 | Japan | C23F 1/00 |
| 924-926 | 4/1982 | U.S.S.R. | 156/156 |
| 1257730 | 9/1986 | U.S.S.R. | 156/156 |

OTHER PUBLICATIONS

Palik et al., "Fabrication and Characterization of Si Membranes," *J. Electrochem. Soc.*, Dec. 1988.

*Primary Examiner*—Rodney McDonald
*Attorney, Agent, or Firm*—Chapman & Cutler

[57] ABSTRACT

An etching apparatus comprises a first tank for containing an etchant, a second tank for containing a non-etchant, a partition positioned between the first tank and the second tank and consisting of a plurality of partition planes, and holders for holding a plurality of substrates against the partition. One or more openings are formed in each partition plane of the partition, and the substrates are held against the partition so that the openings formed in the partition planes are closed by the substrates. Each substrate is larger than the associated opening in size and has a top surface and an etching surface on the bottom. Each of the holders holds one of the substrates so that the etching surface of the substrate is exposed to the etchant contained in the first tank through the opening without touching the non-etchant and that the top surface of the substrate is exposed to the non-etchant contained in the second tank without touching the etchant. The size and/or the shape of the opening can be adjusted according to the size and/or the shape of the substrate.

18 Claims, 6 Drawing Sheets

ETCHING APPARATUS AND METHOD FOR MANUFACTURING OPTICAL DEVICES

BACKGROUND OF THE INVENTION

1. Field of Invention

The present invention relates to an etching apparatus which is suitable for manufacturing an optical device with a membrane (e.g., an X-ray transmission device or transmission filter), and to a method for manufacturing an optical devices having a membrane.

2. Description of the Related Art

As an X-ray filtering optical device, zone plates are broadly used. A typical zone plate is shown in FIG. 4, which has a membrane 32 having a thickness of 1 micron or less, and a circular diffraction grating pattern 33' which is made of an X-ray absorbing material 33 and positioned on the membrane 32.

To support the membrane 32, a silicon wafer (substrate) 31 having a thickness of several hundred micron is generally used. A general method for manufacturing such a zone plate comprises the steps of forming silicon nitride films 32' and 35' on the top and bottom surfaces of the substrate 31 by vacuum deposition up to a thickness of about 0.1 micron, and etching the bottom silicon nitride film 35' by, for example, an RIE method, to complete a silicon nitride film 35 having an aperture 34.

The membrane 32 is a part of the top silicon nitride film 32' and positioned directly above the aperture 34. An example of the vacuum deposition for forming the silicon nitride films 32' and 35' is a low-pressure chemical vapor deposition (LPCVD) method. In order to efficiently control the stress of the membrane, the stoichiometric ratio of Si to N is set so that Si is slightly rich.

The pattern 33' is formed of an X-ray absorbing material on the silicon nitride film 32'. Examples of the X-ray absorbing material include gold, tungsten, tantalum, chromium, nickel, and any other materials that have very low transmissivities to X-rays at the wavelength in use and are easily micropatterned. The pattern 33' can be formed by, for example, an RIE method, a lift-off method, plating, or electron-beam lithography.

Then, the silicon substrate 31 is etched from the aperture 34 of the bottom silicon nitride film 35 so that the bottom face of the membrane 32 is exposed above the aperture 34. Preferably, the silicon substrate 31 is etched by wet etching using ammonia solution or potassium hydroxide solution as an etchant.

Potassium hydroxide solution is corrosive to monocrystalline silicon, but is not corrosive to silicon nitride. Taking advantage of this property, the silicon nitride film 35 functions as the mask for etching the silicon substrate 31.

When the substrate 31, which is covered with the silicon nitride films 32' and 35, is immersed in the slightly heated etchant, the silicon substrate 31 is etched only from the aperture 34 until reaching the top silicon nitride film 32' which remains as the membrane 32 without being etched.

The etching speed of the potassium hydroxide solution differs to a great extent depending on the surfaces with respect to the crystallographic axis of the silicon substrate 31. In particular, the silicon substrate 31 is hardly etched in the lateral direction, while it is easily etched in the vertical direction in FIG. 4. Accordingly, the dimensions of the membrane 32 becomes slightly smaller than those of the aperture 34.

There are many other membrane optical devices other than zone plates. For example, various types of X-ray filters, X-ray transmission masks, electron-beam exposure masks are known. These devices are all manufactured by etching in the similar manner as the zone plates.

The etching rate of silicon slightly varies depending on the type or the temperature of etchant used; however, it is generally in the range from several micrometer per minute to several tens micrometer per minute. In order to completely etch a silicon board having a thickness of several hundred micrometer to several millimeter, it takes about 5–12 hours.

In this situation, a conventional etching apparatus achieves only a few etching cycles a day, and the yield of a conventional etching apparatus for manufacturing optical devices is very low.

Since membrane optical devices fabricated by etching are broadly used in various fields, the sizes and the shapes of the membrane optical devices differ depending on their purpose and use. Naturally, the sizes and the shapes of the base materials (i.e., the substrates) which are to be etched in the manufacturing process also differ depending on the use.

Conventionally, when a novel membrane device is conceived and developed, a new etching apparatus is designed according to the size and the shape of the new device. To this end, certain amount of time and expense are required before the new device is actually manufactured. This implies that each etching apparatus is not efficiently used and that the manufacturing cost of optical devices is increased.

Another problem is that if wet etching is performed using an etchant in the conventional etching apparatus, the X-ray absorber pattern 33' formed on the silicon nitride film 32' often peels off, or it is corroded by the etchant.

For example, it takes 5–6 hours to etch a silicon substrate having a thickness of 400 mm. In this case, most of the X-ray absorber pattern peels off from the silicon nitride film (i.e., the membrane) 32 on the substrate through the etching process. In addition, the membrane may irreversibly deform or break during the etching process using the conventional etching apparatus.

SUMMARY OF THE INVENTION

This invention was conceived in view of these problems in the prior art, and it is an object of the invention to provide an etching apparatus and a method for manufacturing an optical device having a membrane using this etching device, which can improve the productivity of the apparatus and reduce the manufacturing cost of the membrane optical devices.

It is another object of the invention to provide an etching apparatus which can prevent deformation or breakage of the membrane of the optical device during the etching process, and which can prevent damage on the absorber pattern formed on the membrane. It is still another object of the invention to provide a method for manufacturing an optical device having a membrane without causing deformation or breakage of the membrane.

In order to achieve the objects, in one aspect of the invention, an etching apparatus which comprises a first tank for containing an etchant, a second tank for containing a non-etchant, a partition positioned between the first tank and the second tank to separate the first and second tanks in the etching apparatus, and a holder for holding a substrate to be etched against the partition, is provided.

In the first embodiment of present the invention, the partition has an opening whose size and/or shape are adjustable. The substrate has a top surface, on which a membrane material layer is formed, and an etching surface on the bottom. The substrate is larger than the opening in size, so that the opening of the partition is closed by the substrate. The holder holds the substrate against the partition so that the etching surface of the substrate is exposed to the etchant contained in the first tank through the opening without touching the non-etchant and that the top surface of the substrate is exposed to the non-etchant in the second tank without touching the etchant.

The partition comprises a base wall, and an auxiliary board having an opening which is fixed to the base wall. The auxiliary board is interchangeable with another auxiliary board having a different size and/or shape of opening.

A mechanism for changing or adjusting the size and/or the shape of the opening of the auxiliary board may be provided to this partition.

In another embodiment of the present invention, the partition has a plurality of partition planes, each plane having an opening, so that a plurality of substrates can be hold against the partition. Each substrate has a top surface, on which a membrane material layer is formed, and an etching surface on the bottom. The substrates are larger than the openings in size so that the openings of the partition planes are closed by the substrates. Each holder holds one of the substrates against the partition so that the etching surface of the substrates is exposed to the etchant contained in the first tank through the opening without touching the non-etchant and that the top surface of the substrates is exposed to the non-etchant in the second tank without touching the etchant.

One or more openings may be formed in each of the partition planes. The plurality of openings formed in the partition may have different sizes and/or shapes so that the etching apparatus can treat different types of substrates having different sizes and/or shapes.

The etching apparatus may further comprise an inlet/outlet mechanism for supplying the etchant and the non-etchant to the first tank and the second tank simultaneously and for draining the etchant and the non-etchant from the first tank and the second tank simultaneously, and a control mechanism for keeping the surface levels of the etchant and the non-etchant substantially equal or keeping the pressures of the etchant and the non-etchant on the substrate substantially equal.

The etching apparatus further comprises a mechanism for placing and removing the substrate which is held by the holder against the opening of the partition in and from a predetermined position of the etching apparatus, while preventing the top surface of the substrate from touching the etchant and preventing the etchant and the non-etchant from mixing with each other in the etching apparatus.

The placing and removing mechanism is, for example, a stretch mechanism or a driving mechanism for moving the partition vertically. When the opening of the partition is positioned between the first tank and the second tank in the etching apparatus, the partition and the substrate held against the opening prevent the etchant and the non-etchant from mixing with each other with help of a sealing member. On the other hand, when the opening is positioned out of the etching apparatus, the partition separates the etchant and the non-etchant with help of the sealing member.

A control mechanism for keeping the surface levels of the etchant and the non-etchant substantially equal or keeping the pressures of the etchant and the non-etchant on the substrate substantially equal may be used in combination with the placing and removing mechanism.

In another aspect of the invention, a method for manufacturing an optical device having a membrane using the etching apparatus described above is provided. This method comprises the following steps:

(1) preparing at least one substrate having a top surface, on which a membrane layer or laminated layers of etching stopper and membrane material is/are formed, and a bottom surface, on which an etching mask layer is formed;

(2) forming an aperture in the etching mask layer of each of the substrates;

(3) holding the substrates against the partition of the etching apparatus by means of the holders so that the openings of the partition are closed by the substrates; the substrates being held so that the apertures of the etching mask layer faces the first tank through the openings of the partition and that the membrane layer faces the second tank; and (4) supplying the etchant and the non-etchant into the first tank and the second tank, respectively, thereby etching the substrates from the apertures of the etching mask layers until the membrane layers are exposed.

In still another aspect of the invention, a method for manufacturing an optical device having a membrane using the etching apparatus described above comprises the following steps:

(1) preparing at least one substrate having a top surface on which a membrane material layer or laminated layers of etching stopper and membrane material is formed, and a bottom surface on which an etching mask layer is formed;

(2) forming an aperture in the etching mask layer of each of the substrates;

(3) forming a light absorbing pattern layer or an optical filtering layer on the membrane material layer of each of the substrates;

(4) holding the substrates against the partition of the etching apparatus by means of the holders so that the openings of the partition are closed by the substrates, each substrate being held so that the aperture of the etching mask layer faces the first tank through the opening of the partition and that the light absorbing pattern layer or the optical filtering layer faces the second tank; and (5) supplying the etchant and the non-etchant into the first tank and the second tank, respectively, thereby etching the substrates from the apertures of the etching mask layer until the membrane layer is exposed.

In this method, the ratio of the specific gravity of the non-etchant to the specific gravity of the etchant is set to the range from 0.7 to 1.3.

It is more preferable to set the ratio of the specific gravity of the non-etchant to the specific gravity of the etchant to the range from 0.85 to 1.15. At the same time, the ratio of the distance from the center of the substrate to the surface of non-etchant to the distance from the center of the substrate to the surface of the etchant is set to the range from 0.9 to 1.1.

In the first embodiment of the present invention, the size and/or the shape of the opening of the partition is changed or adjusted according to the size and/or the shape of an object to be etched. By simply changing or adjusting the size and/or the shape of the opening, different types of objects (i.e., substrates) having different sizes or shapes can be etched using the same etching apparatus.

In order to change or adjust the size and/or the shape of the opening, an opening adjustor mechanism is provided to the partition. Alternatively, the partition is designed so as to be interchangeable with another partition having a different size and/or shape of opening. When the partition comprises a base wall, and an auxiliary board having an opening which is fixed to the base wall, the auxiliary board is changed with another auxiliary board having a different size and/or shape of opening. Of course, a mechanism for changing or adjusting the size and/or the shape of the opening of the auxiliary board may be provided to this partition.

Multiple types of partitions having different sizes and/or shapes of openings are prepared in advance. The most suitable partition is selected and fixed between the first and second tanks of the etching apparatus whenever a new type of substrate is etched. The size of the opening should be larger than the etching area of the substrate to be etched.

When an auxiliary board is used, the substrate to be etched is held against the auxiliary board so as to close the opening formed therein, and then this auxiliary board is fixed to the base wall in the etching apparatus. Again, the opening size is set larger than the etching area of the substrate.

As has been mentioned, the holder holds the substrate to be etched so that the etching surface of the substrate is exposed to the etchant contained in the first tank, but never touch the non-etchant in the second tank, and that the top surface of the substrate, on which the absorber pattern is formed, is exposed to the non-etchant without touching the etchant in the first tank.

The partition in the present invention may have a plurality of partition planes, each plane having an opening which is smaller than the substrate to be etched. The holder holds a plurality of substrates, which are larger than the openings, against the partition so that the openings are closed by the substrates to be etched. Because the etching apparatus can hold a plurality of substrates in it, multiple substrates can be etched at a time. This can greatly improve the productivity of the apparatus. In order to further improve the productivity, several openings may be formed in each of the partition plane. In addition, by forming different sizes and/or shapes of openings, different types of substrates can be etched in the same etching apparatus.

This etching apparatus can eliminate the necessity of newly designing a tank or an etching apparatus for a novel etching object. Consequently, the time and the cost required to set up the apparatus is reduced and, as a result, the productivity of various types of optical devices having membranes are improved.

This arrangement can prevent the absorber pattern on the membrane from being damaged by the etchant. The damage to the absorber pattern was a serious problem in manufacturing an optical device having a membrane with conventional techniques. This problem is eliminated by holding the substrate so that the top surface does not touch the etchant.

These methods may further comprise the step of controlling the surface levels of the etchant and the non-etchant so as to be at a substantially equal level.

The inlet/outlet mechanism supplies the etchant and the non-etchant to the first tank and the second tank simultaneously at a same rate. It also drains the etchant and the non-etchant from the first tank and the second tank at a same rate in order to avoid the situation where the pressure applied to one surface of the membrane becomes higher than the pressure applied to the other surface of the membrane. The control mechanism also controls the pressure of the two solutions. In particular, the control mechanism keeps the surface level of the etchant and the non-etchant substantially equal or keeps the pressures of the etchant and the non-etchant on the substrate substantially equal.

Thus, the irreversible deformation or breakage of the membrane, which was also a problem in the conventional techniques, can be prevented.

If the substrate and the membrane material layer are sufficiently thick and have sufficient mechanical strengths, it is not necessary to supply the etchant and the non-etchant simultaneously at a same rate. However, if the substrate and the membrane material layer are very thin and have less endurance to the pressure difference between the two solutions, the etchant and the non-etchant are supplied to the respective tanks at a time using, for example, a supply mechanism p shown in FIG. 5.

For example, in FIG. 5, the sample 30 was already subjected to the etching process, but it needs to be etched again because of insufficient etching. In this case, the portion that corresponds to the membrane became thin, and it must be treated carefully under the same pressure onto both side of the substrate.

The substrate placing and removing mechanism is useful to keep the top surface of the substrate away from the etchant and keep the etchant and the non-etchant unmixed with each other in the etching apparatus, whereby irreversible deformation or breakage of the membrane is prevented.

The placing and removing mechanism is, for example, a stretch mechanism or a driving mechanism for moving the partition vertically. When the opening of the partition is positioned between the first tank and the second tank in the etching apparatus, the partition and the substrate held against the opening prevent the etchant and the non-etchant from mixing with each other with help of a sealing member. On the other hand, when the opening is positioned out of the etching apparatus, the partition separates the etchant and the non-etchant with help of the sealing member.

A control mechanism for keeping the surface levels of the etchant and the non-etchant substantially equal or keeping the pressures of the etchant and the non-etchant on the substrate substantially equal may be used in combination with the placing and removing mechanism.

This combination can further enhance the breakage preventing effect.

In the manufacturing process, the ratio of the specific gravity of the non-etchant to the specific gravity of the etchant is set to the range from 0.7 to 1.3.

The surface levels of the etchant and the non-etchant are kept substantially equal during the etching process.

It is more preferable to set the ratio of the specific gravity of the non-etchant to the specific gravity of the etchant to the range from 0.85 to 1.15. At the same time, the ratio of the distance from the center of the substrate to the surface of non-etchant to the distance from the center of the substrate to the surface of the etchant is set to the range from 0.9 to 1.1. These arrangements can efficiently prevent the irreversible deformation or breakage of the membrane.

In general, a membrane is very thin (with a thickness of about 1 micron) and its mechanical strength is not so strong. Accordingly, a small amount of biased pressure may cause the membrane to deform or break.

In other words, if the specific gravities or the surface levels differ to a great extent between the etchant and the non etchant, the membrane is likely to break or irreversibly deform.

For example, if water is used as the non-etchant, and if the surface level of the water is kept equal to that of the etchant in the first tank, then the membrane material layer or the etched substrate may deform or break at the opening of the partition between the first and second tanks when the etching process approaches the final stage.

This is because the specific gravity of water is much less than that of the etchant. If the surface levels of these two solutions having very different specific gravities are kept equal, the pressures applied to the substrate would differ between the top surface and the etching surface. If the pressure difference exceeds the durability of the membrane, the membrane deforms or breaks.

Controlling the surface levels of the two solutions based on their specific gravities may reduce the pressure difference; however, it is not easy to constantly detect and adjust the surface levels so as to keep the pressures applied to both surface of the substrate substantially equal.

In contrast, if the specific gravities of the etchant and the non-etchant are set equal or close to each other, the pressures applied on the top and the bottom surfaces of the substrate become almost equal as long as the surface levels of the two solutions are kept equal.

Thus, deformation or breakage of the membrane can be prevented by the simple way, whereby optical devices having a membrane are reliably manufactured.

The etching apparatus and the manufacturing method of the invention are not limited to X-ray absorbing devices, but are applicable to X-ray transmission masks and other optical devices having even thinner and larger membranes.

BRIEF DESCRIPTION OF THE DRAWINGS

The above and other objects, features, and advantages of the present invention will be apparent from the detailed description which follows with reference to the attached drawings wherein.

DESCRIPTION OF THE PREFERRED EMBODIMENTS

First Embodiment

Figure 1:
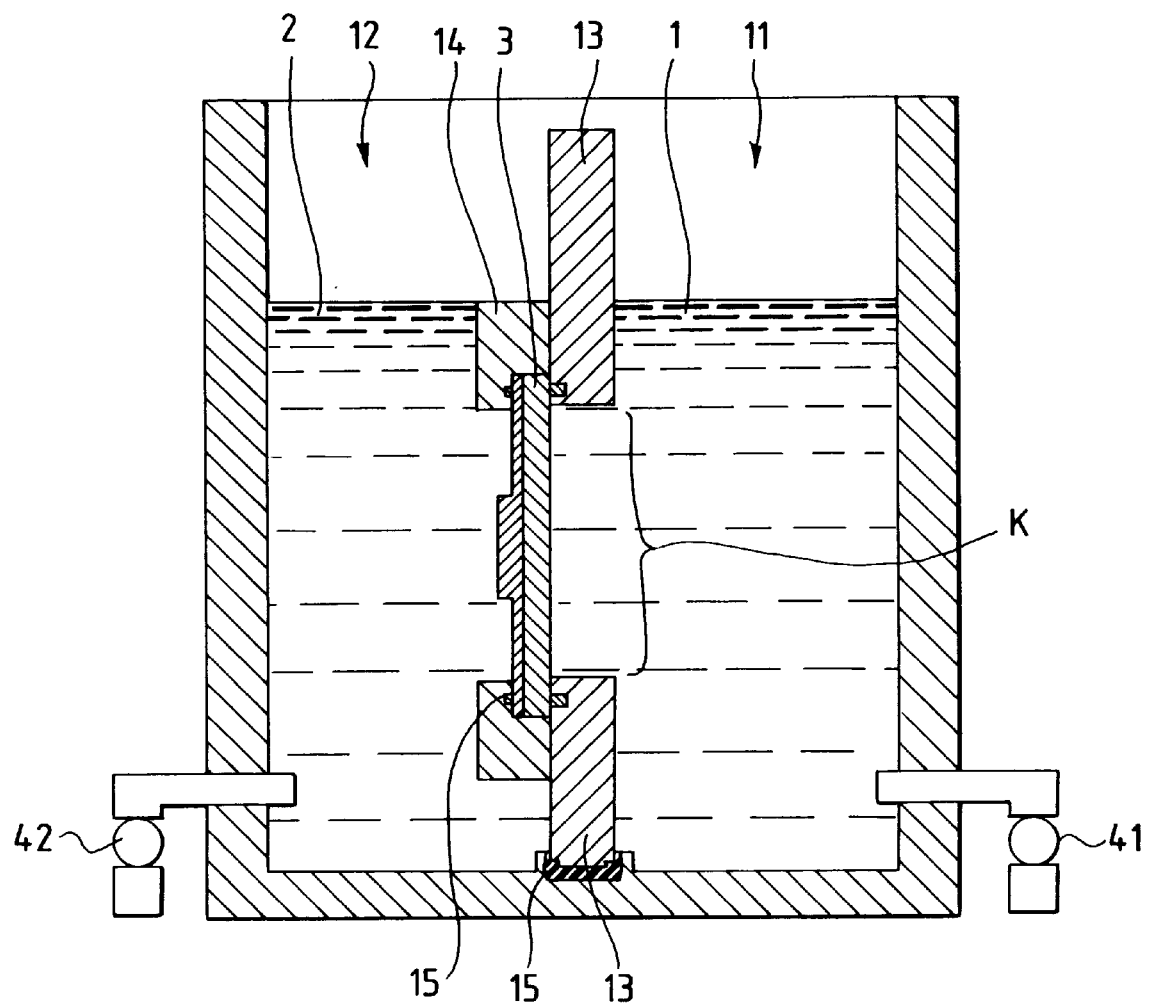
FIG. 1 is a vertical cross-sectional view of the etching apparatus according to the first embodiment, which is also used in the manufacturing method according to the second embodiment.

FIG. 1 shows the etching apparatus in a cross-sectional view according to the first embodiment of the invention.

This etching apparatus comprises a first tank 11 containing etchant 1, a second tank 12 containing non-etchant 2, a partition 13 having an opening (k), which is positioned between the first tank 11 and the second tank 12, and a holder 14 for holding an object (substrate) 3 to be etched so that the opening (k) is closed by the substrate 3. The opening (k) is slightly smaller than the substrate 3 which is to be etched. In this context, the bottom surface of the substrate 3 is the etched surface, and a membrane material layer and an absorber pattern are formed on the top surface of the substrate 3. The holder 14 secures the substrate 3 on the side of the second tank 12 so that the etched surface of the substrate 3 is exposed to the etchant 1 contained in the first tank 11 through the opening (k) and that the opposite surface, on which the membrane material layer and the absorber pattern are formed, is immersed in the non-etchant 2 contained in the second tank 12. The etched surface of the substrate 3 does not touch the non-etchant 2, and the absorber surface is not exposed to the etchant 1.

In this arrangement, the absorber pattern formed on the membrane material layer is not damaged because only the etched surface of the substrate 3 is exposed to the etchant 1. This arrangement can also prevent damage or irreversible deformation of the membrane during the etching process, which is often caused in the conventional techniques. The etching apparatus also has outlet valves 41 and 42 for draining the etchant 1 and the non-etchant 2 from the tanks 11 and 12 at the same time, while retaining the substrate 3 on the opening (k).

The valves 41 and 42 are also used to keep the surface levels of the two solutions substantially equal.

In order to facilitate the adjustment of the surface levels of the two solutions, the etching apparatus is designed so that the horizontal cross-sectional areas of the first and second tanks 11 and 12 are substantially equal.

Anti-volatile films or buoys may be placed on the surfaces of the etchant 1 and the non-etchant 2 so that the surface levels of the two solutions are kept equal.

A heater (not shown) is provided to heat the etchant 1 and the non-etchant 2 contained in the first and second tanks 11 and 12, respectively.

The partition 13 can be easily replaced by another partition having an opening of difference dimensions according to the size and the shape of the substrate 3 which is to be etched. Alternatively, a stretch mechanism may be provided to the partition 13 for directly adjusting the dimensions of the opening (k).

By changing or adjusting the size and the shape of the opening (k), many different sizes of optical devices can be etched using the same etching apparatus without damaging the membrane or the absorber pattern.

Another embodiment of the present invention includes at least a first chamber for accommodating an etchant; a second chamber for accommodating a non-etchant; a wall member disposed between the first and second chambers and having an opening; and a supporting member for supporting an object to be etched which is larger than the opening so as to close the opening, the supporting member being capable of supporting the object to be etched in such a manner that an etch surface is brought into contact with the etchant accommodated in the first chamber without being brought into contact with the non-etchant accommodated in the second chamber and that a rear surface of the etch surface is brought into contact with the non-etchant accommodated in the second chamber without being brought into contact with the etchant accommodated in the first chamber.

More specifically, when a substrate on which a membrane material layer having the absorber pattern is formed on one surface is appropriately set on the supporting member of the etching apparatus according to the present invention, the etch surface (corresponding to a surface of the substrate opposite to the membrane material layer with the absorber pattern) is brought into contact with the etchant accommodated in the first chamber without being brought into contact with the non-etchant accommodated in the second chamber, and the rear surface (corresponding to a surface on which the membrane material layer with the absorber pattern is formed) is brought into contact with the non-etchant accommodated in the second chamber without being brought into contact with the etchant accommodated in the first chamber. Therefore, the absorber pattern can be prevented from being damaged during the fabrication of the optical device.

The etching apparatus according to this embodiment of the present invention further includes a mechanism for at least either performing injection of the etchant into the first chamber and injection of the non-etchant into the second chamber simultaneously or performing exhaustion of the etchant from the first chamber and exhaustion of the non-etchant from the second chamber simultaneously, and another mechanism for controlling surface layers of the etchant and non-etchant or pressures of the etchant and non-etchant applied to the object to be etched so as to be equal or approximately equal to each other.

In a case where the thickness of the object to be etched is large enough or the mechanical strength of the object to be etched is strong enough to sufficiently stand up to the pressure difference between the etchant and non-etchant (the irreversible deformation and the damage cannot occur), the injection of the etchant into the first chamber and the injection of the non-etchant into the second chamber are not necessarily performed simultaneously after the object to be etched is set on the supporting member. On the contrary, in the case where the thickness of the object to be etched is too small or the mechanical strength of the object to be etched is too small to stand up to the pressure difference between the etchant and non-etchant (the irreversible deformation or the damage occurs), it is necessary to inject the etchant and non-etchant simultaneously (see FIG. 4, a two-liquids simultaneous injection mechanism p is used).

Such an object to be etched includes an object in which the etching is performed once in order to form the membrane and the fine pattern, for example. Also, for example, an object in which the etching needs to be performed again because of the failure of the first etching is included (see FIG. 4).

The etching apparatus according to the present invention includes a mechanism for at least either placing the object to be etched supported on the opening by the supporting member into the etchant and non-etchant or taking out the object to be etched from the etchant and non-etchant, so as not to bring the rear surface of the etch surface into contact with the etchant accommodated in the first chamber and not to mix the etchant and non-etchant.

Thus, the etching apparatus of the present invention can prevent the irreversible deformation and the damage of the membrane to be formed that is one of the problems during the fabrication of the optical device having the membrane.

As the aforementioned mechanism, an extending mechanism for the wall member or a moving mechanism for the wall member can be used, which can prevent the mixing of the etchant and non-etchant by the object to be etched supported on the opening, the wall member, and a seal member when the opening is disposed in the etchant and non-etchant, and which can prevent the mixing of the etchant and non-etchant by the wall member, or by the wall member and the seal member when the opening is disposed outside the etchant and non-etchant It is preferable to further include another mechanism for controlling surface levels of the etchant and non-etchant or pressures of the etchant and non-etchant applied to the object to be etched so as to be equal or approximately equal to each other.

Now, an example of manufacturing process of a zone plate using the etching apparatus of the first embodiment will be explained.

First of all, a substrate whose top surface is covered with a membrane material layer and whose bottom surface is covered with an etching-mask layer, is prepared. An etching stopper layer may be inserted between the membrane material layer and the top surface of the substrate.

Second, an aperture is formed in the etching-mask layer at a position corresponding to the membrane.

Third, a light absorbing pattern layer or an optical filtering layer is formed on the membrane material layer. At this point, the substrate is ready to be etched.

Fourth, the substrate to be etched is secured by the holder 14 so that the aperture of the etching mask layer faces the first tank 11 and that the absorber pattern layer (or the optical filtering layer) faces the second tank 12. The opening (k) of the partition 13 is now closed by the substrate to be etched, and the first and second tanks 11 and 12 are completely separated.

Finally, an etchant 1 is poured into the first tank 11, while non-etchant 2 is poured into the second tank 12. The substrate is etched from the aperture of the etching-mask layer until the bottom surface of the membrane or the etching stopper layer, if there is, is exposed. Since the substrate is etched mainly in the height direction, while it is hardly etched in the direction parallel to the top surface, the membrane is formed at a position corresponding to the aperture of the etching-mask layer.

Figure 3:
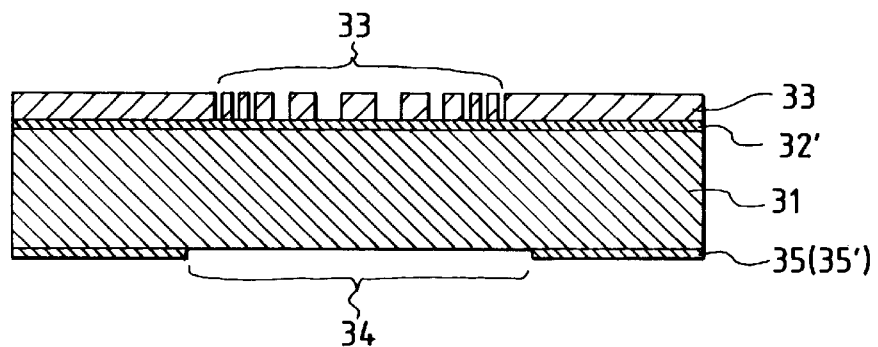
FIG. 3 is a vertical cross-sectional view of a zone plate which is in the middle stage of the manufacturing process.
Figure 4:
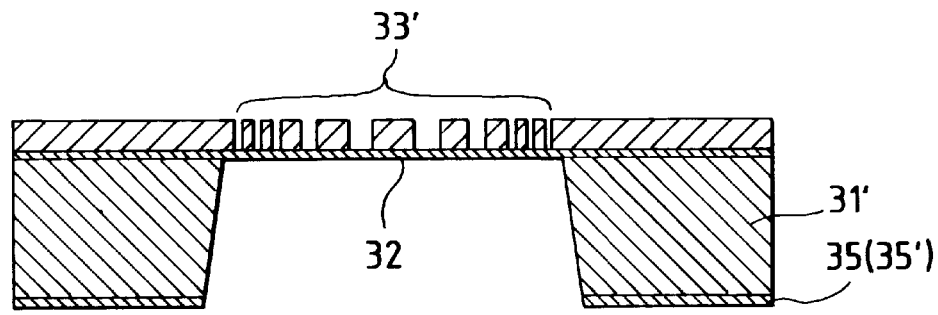
FIG. 4 is a vertical cross-sectional view of a completed zone plate.
Figure 5:
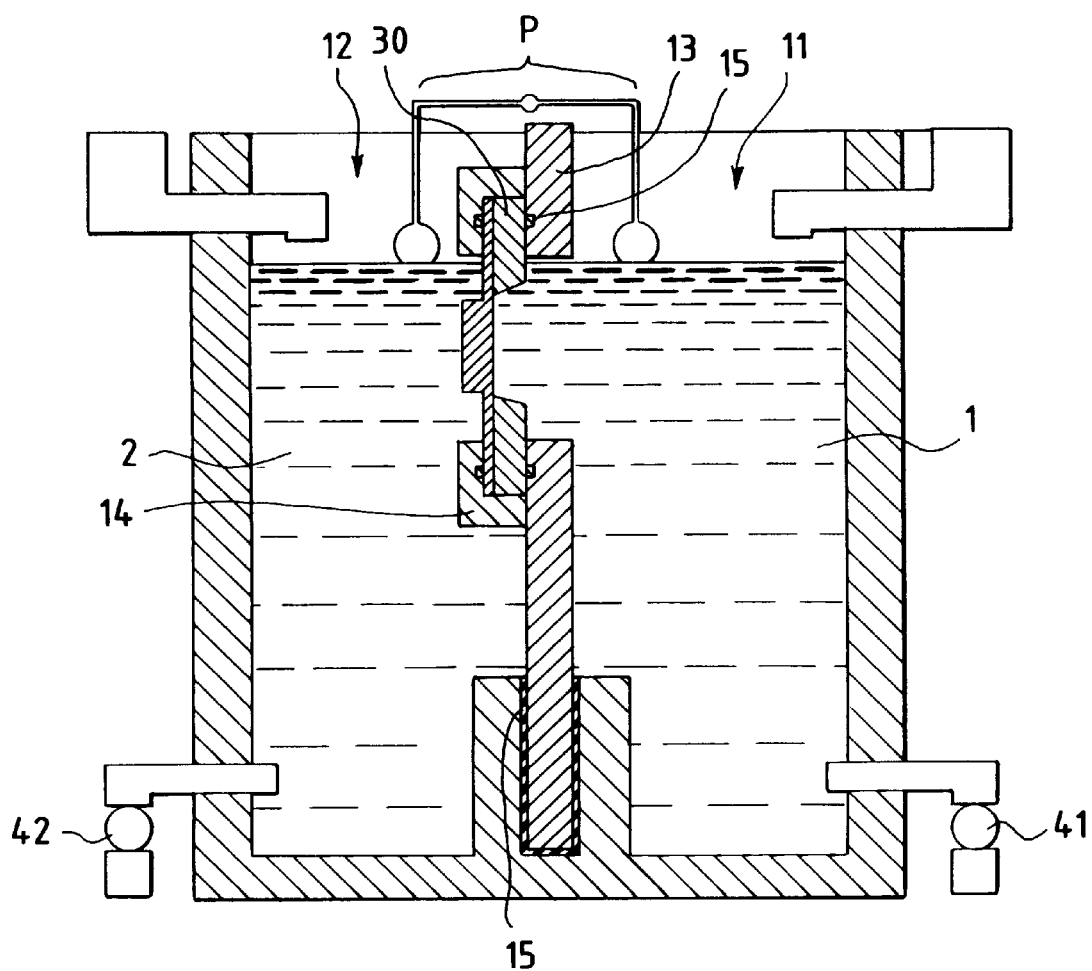
FIG. 5 is a vertical cross-sectional view of a modification of the etching apparatus of the present invention.

Each of these steps will be explained in more detail with reference to FIGS. 1, 3 and 4.

In the first step, a silicon nitride (SiNx) film having a thickness of 0.1 mm is formed on the top and bottom surfaces of the silicon substrate 31 (with a size of 2-inch$^2$ and a thickness of 400 mm) by a low-pressure chemical vapor deposition (LPCVD) method. The top silicon nitride film is referred to as the membrane material layer 32' (which also serves as the etching stopper layer), and the bottom silicon nitride film is referred to as the etching-mask layer 35'.

The silicon nitride film is formed using a TOYO Lindbergh LPCVD system MODEL 270 M100, under the conditions of $SiH_2Cl_2$ flow of 75 sccm, $NH_3$ flow of 11 sccm, and the gas temperature of 800° C. The top silicon nitride film ends up the membrane 32 and the bottom silicon nitride film 35' is used as the etching mask 35.

In the second step, an aperture 34 is formed at a predetermined position in the bottom silicon nitride film 35' by a photo-litho method.

Prior to forming the aperture 34, a resist pattern of the aperture 34 is formed on the bottom silicon nitride film 35', and the aperture pattern is transferred onto the silicon nitride film 35' by an RIE method.

In the RIE method, etching is performed for three minutes using 20 sccm $CF_4$ gas and 2 sccm $O_2$ gas as the etching gases, under the conditions of a gas pressure of 5 Pa and an Rf output of 100 W.

The material of the silicon etching mask is not limited to the SiNx film. Many other materials, including SiOx and SiNO, can be used as long as the material is anti-corrosive to the silicon etchant and suitable to pattern formation.

In the third step, a metal layer 33 having a thickness of 0.2, mm is formed on the top silicon nitride film 32'. The metal layer 33 is used as the X-ray absorber. In order to hold the X-ray absorber firmly, a titanium film having a thickness of about 50 Å may be formed between the top silicon nitride film 32' and the metal layer 33. In the embodiment, gold is used as the material of the X-ray absorber.

The titanium film and the gold film are formed by magnetron sputtering in the Ar gas atmosphere. Titanium is sputtered for one minute under the Ar gas pressure of 0.9 Pa, and Gold is sputtered for five minutes under the Ar gas pressure of 1 Pa. Before these films are actually formed, presputtering is performed for two minutes for each film under the same condition as the actual sputtering.

Many kinds of metals, including tantalum, chromium, nickel and these alloys, can be used as the X-ray absorber as long as they have high absorbance to rays having a wavelength in use and suitable to micropatterning.

In this embodiment, the metal film 33, as the material of the soft X-ray absorber, is micropatterned to form a large-aperture zone plate pattern 33'.

In the micropatterning, a resist is applied to the metal film 33 and, then the zone plate pattern, which consists of a number of concentric circles, is printed on the resist by a photo-litho method. The innermost diameter of the pattern is 32.7 mm, the number of zones (circles) is 4,300, the diameter of the zone plate is 4.3 mm, and the wavelength in use is 4 nm.

As a result of the printing of the pattern, the resist remains inside the innermost circle (r1) and outside the outline of the zone plate pattern. L&S is formed from the innermost circle toward the outer circumference.

Using this resist pattern as a mask, the pattern is transferred to the metal layer 33 by ion beam etching using EIR-200ER manufactured by Elionics Inc.

In EIR-200ER, argon gas is ionized with application of an acceleration voltage of 700V. After the pattern transfer, the remaining resist pattern which was used as the etching mask is removed by oxygen ashing, whereby the substrate 3, which is to be etched in the etching tank 11, is completed.

In the fourth and the fifth steps, the substrate (i.e., the zone plate sample) 3 is placed in the etching apparatus as shown in FIG. 1. The silicon substrate 31 is etched from the aperture 34 of the etching-mask film 35' until the membrane 32 is exposed.

Before the zone plate sample 3 is fixed to the etching apparatus, the substrate 3 having the X-ray absorber pattern thereon is cut into a 30 mm square sample. This zone plate sample 3 is retained by the holder 14 so that the aperture 34 of the bottom silicon nitride film (i.e., the etching-mask film) 35 faces the first tank 11 and that the zone plate pattern (i.e., the X-ray absorber pattern) 33' faces the second tank 12. In this state, the opening (k) of the partition 13 is closed by the zone plate sample 3.

In this embodiment, the opening (k) of the partition 13 is set to a diameter of 8 mm according to the dimensions of the zone plate sample 3 and the X-ray absorber pattern 33'.

The partition 13 is secured to the main body of the etching apparatus through a sealing member (e.g., an O ring) 15. Another sealing members (O rings) are provided between the partition 13 and the zone plate sample 3 and between the holder 14 and the zone plate sample 3, so that the etchant 1 and the non-etchant 2 would not mix.

The etchant 1 is poured into the first tank 11 from the inlet valve 41, while the non-etchant 2 is poured into the second tank 12 from the inlet valve 42. The substrate 31 is etched from the aperture 34 of the silicon nitride film 35. The silicon nitride film 35 is used as an etching mask, and the substrate 31 is only exposed to the etchant 1 through the aperture 34. The substrate 31 is etched until the membrane 32 is exposed.

In particular, 40 weight percent saccharose solution is used as the non-etchant 2, and 40 weight percent potassium hydride solution is used as the etchant 1. These solutions are poured until the etching surface of the zone plate sample 3 is completely immersed in the etchant 1. At the same time, these solutions are controlled so that the surface levels of the two solutions are always kept equal.

The specific gravity of the saccharose solution is set to equal to that of the potassium hydride solution. As a solvent of the sugar cane solution, water is preferably used because of its easiness to treat, operativity and safety. However, it is not limited to the water.

In general, the solutions contained in the first and second tanks 11 and 12 are heated up to about 85° C. during the etching process. Accordingly, the solutions are easily vaporized. Since the vaporization rate differs among solvents, the solvent of the etchant 1 may be used as the solvent of the non-etchant (i.e., anti-corrosive solution) 2 in order to keep the surface levels of the two solutions substantially equal.

Since the solutions in the tanks 11 and 12 are heated, inflammable solvents must be carefully treated.

In order to keep the surface level of the etchant 1 and the non-etchant 2 in the first and second tanks 11 and 12, the etching apparatus is designed so that the horizontal cross-sectional areas of the tanks 11 and 12 are substantially equal. It is also efficient for keeping the surface levels equal to place anti-vaporization films or buoys on the liquid surfaces of the tanks 11 and 12.

Examples of the substances added to the non-etchant 2 for the purpose of adjusting the specific gravity of the non-etchant includes saccharose, cane sugar, etc., salt (sodium chloride), urea, and any other substances that dissolve in the solvent and that do not corrode or peel off the micropatterned absorbing film or filtering film formed on the membrane.

The range of the specific gravity of the non-etchant 2 depends on the mechanical strength (determined by the property of the material, the thickness, and the area size) of the membrane which is to be formed through the etching process. As the mechanical strength of the membrane decreases, the specific gravity of the non-etchant 2 contained in the second tank 12 must approach the specific gravity of the etchant 1 in the first tank 11.

For example, if a membrane having a thickness of 0.1 mm and a diameter of 35 mm is to be made of $SiN_x$ (x=0.33), and if potassium hydride solution of 40 weight percent is used as the etchant 1, the concentration of saccharose solution (e.g., the non-etchant 2) in the second tank 12 must be between 35 weight percent and 40 weight percent in order to form a satisfactory membrane according to the experiment.

In other words, the membrane was satisfactorily formed when the ratio of the specific gravity of the non-etchant 2 to the specific gravity of the etchant 1 was set from 87.5% to 112.5%.

However, if the membrane size increases, the acceptable range of the ratio of the specific gravities of the two solutions must be narrowed. For example, when forming a membrane having a diameter of 40 mm, a satisfactory membrane cannot be obtained unless the ratio is not less than 91% and not more than 109%. These ranges were measured under the condition that the surface levels of the two solutions were kept at a substantially equal level.

The etching speed of the silicon substrate greatly depends on the temperature of the reacting portion. In order to achieve the etching speed of 1 mm/min or faster, the temperature of the reacting portion must be 75° C. or higher.

In this embodiment, the entirety of the etching tank is heated directly or indirectly, and the temperature of the etchant 1 was kept at 85° C. Under this condition, the etching speed was 1.4 mm/min and the silicon substrate having a thickness of 400 mm was completely etched, that is, a membrane made of silicon nitride is obtained in 5 hours.

Completion of etching was confirmed at a point of time when the zone plate pattern on the membrane was seen through the membrane from the etching side and no more continuous bubbles were generated from the reacting surface.

In order to observe the progress of silicon etching, the etching tank is preferably made of a transparent material, or designed partially transparent so as to allow observation from the outside of the etching apparatus.

The reaction of the silicon etching is expressed by formula (1).

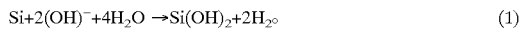

$$Si+2(OH)^-+4H_2O \rightarrow Si(OH)_2+2H_2\circ \quad (1)$$

The bubble generated from the reaction surface is considered as active hydrogen and, accordingly, it is preferable to equip a ventilation system or an exhauster system to perform the etching safely and hygienically.

When silicon etching has been completed, the zone plate sample 3 is taken out of the etching apparatus. Since a thin membrane is formed in the zone plate sample 3, it must be treated carefully so that no large stress is applied to the membrane; otherwise the membrane would break or deform.

In the embodiment, the etchant 1 and the non-etchant 2 are drained from the first and second tanks 11 and 12 simultaneously through the outlet valves 41 and 42, while the zone plate sample 3 is still held by the holder 14. The outlet amount of the etchant 1 and the non-etchant 2 are controlled by adjusting the valves 41 and 42 so that their surface levels are kept equal, whereby undesirable stress or pressure is prevented from being applied to the membrane.

A pump may be used in place of or together with the valves 41 and 42 to drain the solutions from the tanks 11 and 12.

Figure 8A:
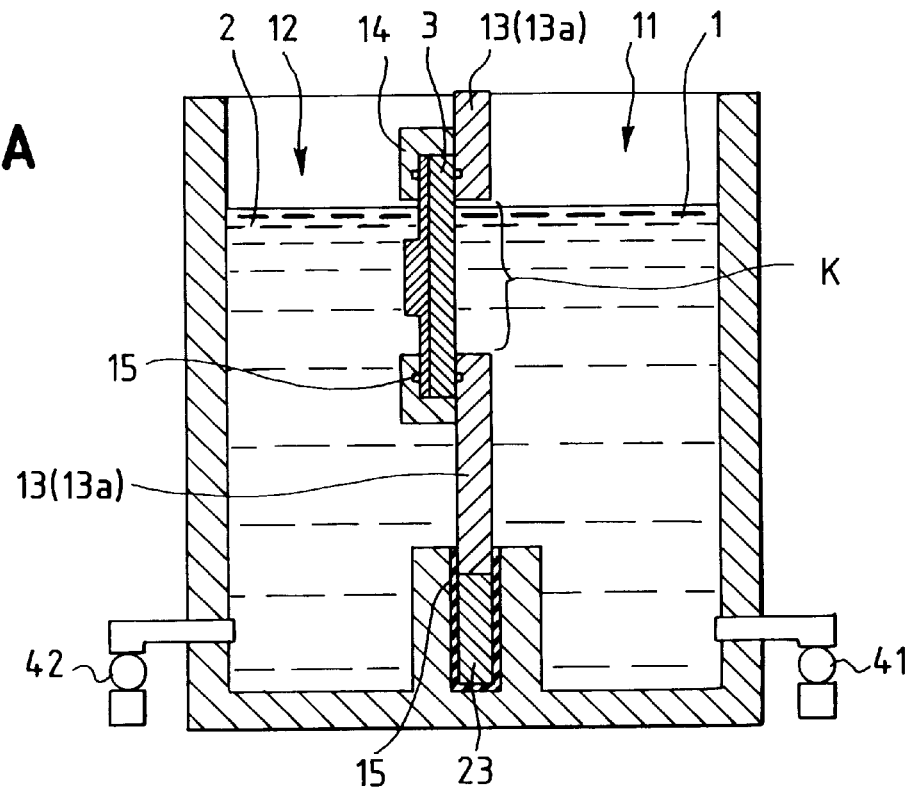
FIG. 8 is a vertical cross-sectional view of another modification of the etching apparatus of the present invention.
Figure 8B:
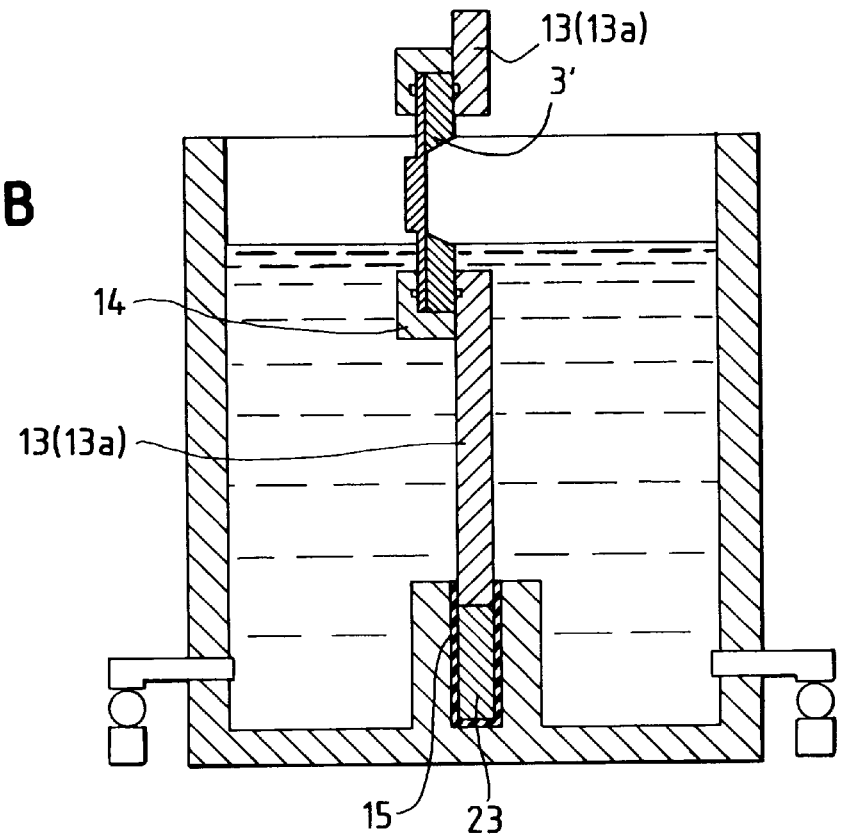

Alternatively, if the solutions are not drained from the tanks 11 and 12, a stretch mechanism 23 for placing and removing the zone plate sample 3 held by the holder 14 against the opening (k) into and from the etching apparatus is used. (See FIG. 8.) With this stretch mechanism 23, the zone plate sample 3 is placed and removed vertically in such a manner that the pattern surface of the sample 3 would never touch the etchant 1 and that the etchant 1 and the non-etchant 2 would not mix with each other.

The stretch mechanism 23 is provided to the partition 13, and vertically elongates and shortens, while supporting the partition 13. The partition 13 and the stretch mechanism 23 are sealed by the O ring 15. In addition, the zone plate sample 3 is held by the holder 14 and sealed by another O ring 15 so that the opening (k) is completely closed by the zone plate sample 3. Consequently, the etchant 1 and the non-etchant 2 are prevented from mixing with each other regardless of the vertical position of the zone plate sample 3.

Since the pressures of the etchant 1 and the non-etchant 2 are kept substantially equal, no undesirable stress is applied to the membrane when the zone plate sample 3 is removed from the etching apparatus upward.

If the zone plate sample 3 and the partition 13 are simply removed from the etching apparatus without using the stretch mechanism 23, the etchant 1 abruptly mixes into the non-etchant 2 immediately after the partition 13 is separated from the o ring 15, which may causes the zone plate pattern 33 to peel off from the membrane 32.

After the zone plate sample 3 is taken out of the etching apparatus, it is well rinsed by water or warm water and dried. The zone plate sample 3 is rinsed so that no large stress that may cause deformation or breakage is applied to the membrane.

The method and the apparatus according to this embodiment can efficiently prevent irreversible deformation or breakage of the membrane, which was a serious problem in the conventional techniques when fabricating a zone plate. In addition, damage or peeling of the absorber pattern can also be prevent.

Second Embodiment

In the second embodiment, an optical filtering layer is formed on the membrane material layer 32', in place of the gold zone plate pattern 33 of the first embodiment. The optical filtering layer has a thickness of 0.2 mm and is made of titanium or scandium. The same etching apparatus and the same etching process as the first embodiment is used to fabricate an optical filter for an X-ray microscope.

In fabricating the optical filter, an octagonal aperture 34 is formed in the etching mask layer 35. The octagon is inscribed in a circle having a diameter of 20 mm in this embodiment. In accordance with this shape and the size of the aperture 34, a partition 13 having an opening (k) with a diameter of 23 mm is used.

The titanium layer or the scandium layer allows soft X-rays to pass through, while visible light is cut off. Thus, this optical filter functions as a visible light cut filter.

The titanium layer or the scandium layer is formed by a magnetron sputtering method under the conditions of a gas pressure of 0.85 Pa and the sputtering time of 25 minutes. Prior to the actual sputtering, presputtering was performed for 2 minutes under the same conditions. The material of the filtering is not limited to titanium or scandium. It is selected according to the use and the purpose of the filter, such as a visible light filter or band-narrowing filter.

However, if the material of the filtering layer has a compressional stress or a strong tensile stress, then the membrane that supports the filtering pattern layer deforms or breaks. To avoid this situation, the material of the filtering layer is selected so that the resultant filtering layer has a tensile stress of $10^8 dyn/cm^2$ to $10^9 dyn/cm^2$.

With this method, an optical filter (that is, an optical device having a membrane) is fabricated without causing deformation or breakage of the membrane, unlike the conventional techniques.

The size and the shape of the opening (k) of the partition 13 is selected according to the size and the shape of the substrate to be etched.

Third Embodiment

Figure 2:
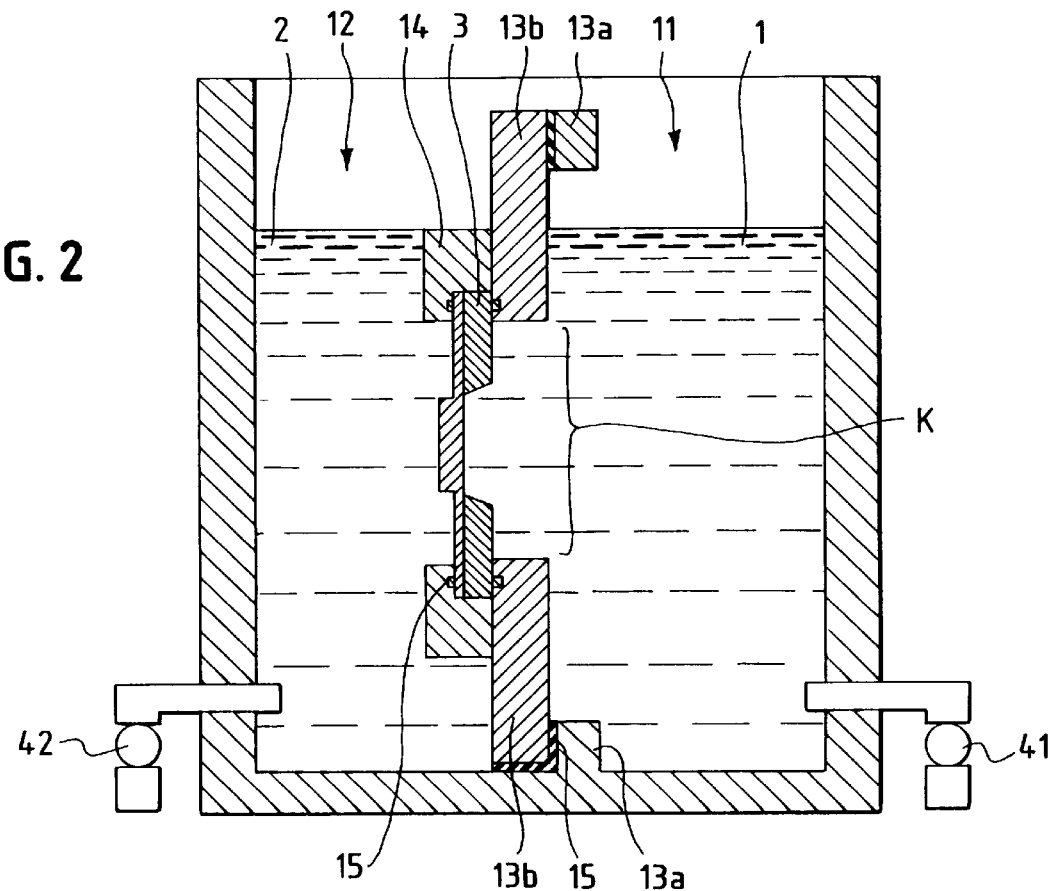
FIG. 2 is a vertical cross-sectional view of the etching apparatus according to the third embodiment.

FIG. 2 illustrates the etching apparatus according to the third embodiment of the invention.

In this etching apparatus, the partition 13 comprises a base wall 13a, which has an opening of φ50 mm, and an auxiliary board 13b, which has an aperture of φ8 mm and is fixed to the base wall 13a. The auxiliary board 13b is interchangeable with another auxiliary board which has an opening of difference size and shape. The other elements are the same as those in the etching apparatus of the first embodiment.

An adjustor mechanism for adjusting or changing the size and or the shape of the opening of the auxiliary board may be further provided to the etching apparatus. A zone plate, which is similar to the zone plate manufactured in the first embodiment, is fabricated using an auxiliary board having an opening of φ8 mm, while an optical filter for an X-ray microscope, which is similar to the X-ray microscope optical filter manufactured in the second embodiment, is fabricated using an auxiliary board having an opening of φ23 mm.

With this etching apparatus, many types of substrates having different sizes and shapes can be etched by simply changing the auxiliary board 13b or adjusting the opening size of the auxiliary board 13b.

Fourth Embodiment

Figure 6:
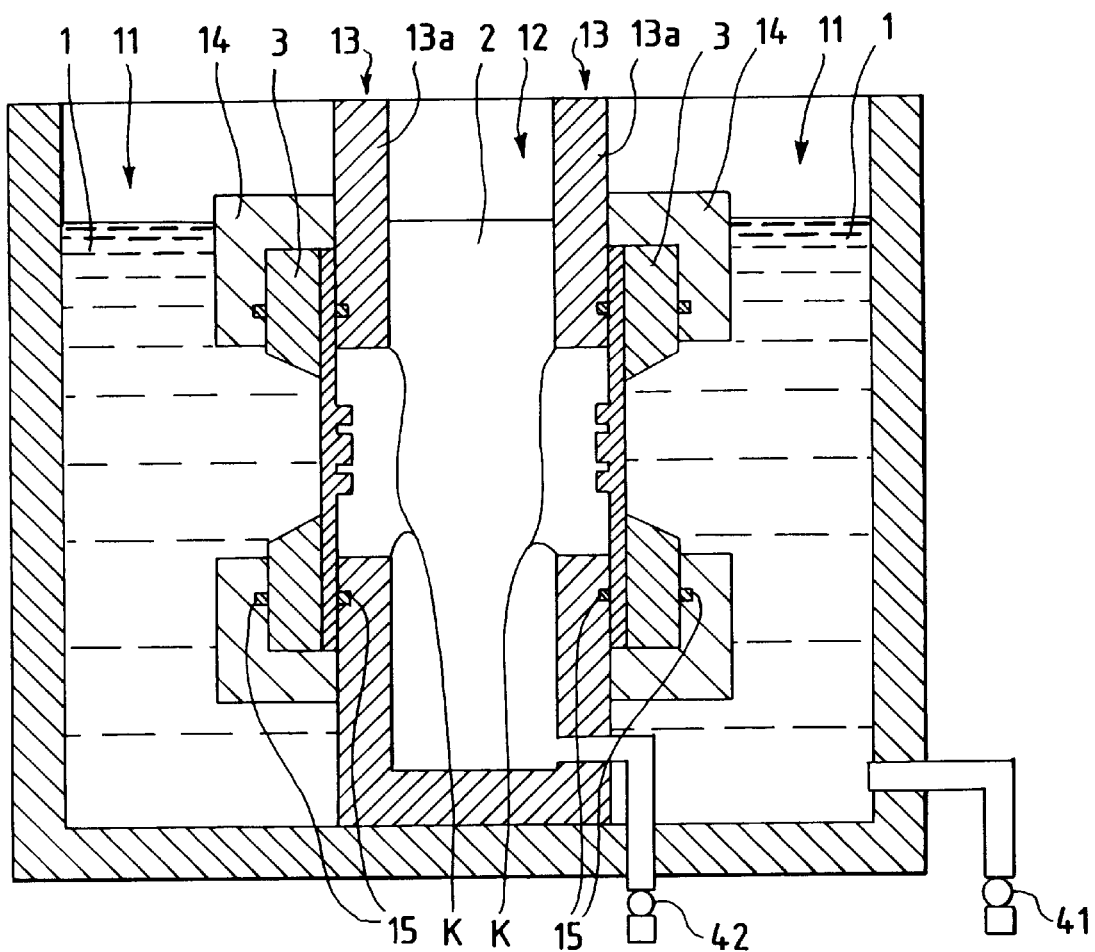
FIG. 6 is a vertical cross-sectional view showing a part of the etching apparatus according to the fourth embodiment, which is also used in the optical device manufacturing method according to the fifth embodiment.

FIG. 6 shows the etching apparatus in a vertical cross-sectional view according to the fourth embodiment of the invention.

This etching apparatus comprises a first tank 11 containing etchant 1, a second tank 12 containing non-etchant 2, a partition 13 having openings (K), which are positioned between the first tank 11 and the second tank 12, and holders 14 for holding objects (substrates) 3 to be etched so that the openings (K) are closed by the substrates 3. The openings (K) are slightly smaller than the substrates 3 which are to be etched. In this context, the bottom surface of the substrate 3 is the etched surface, and a membrane material layer and an absorber pattern are formed on the top surface of the substrate 3. Each holder 14 secures the substrate 3 on the side of the second tank 12 so that the etched surface of the substrate 3 is exposed to the etchant 1 contained in the first tank 11 through the opening (K) and that the opposite surface, on which the membrane material layer and the absorber pattern are formed, is immersed in the non-etchant 2 contained in the second tank 12. The etched surface of the substrate 3 does not touch the non-etchant 2, and the absorber surface is not exposed to the etchant 1.

In this arrangement, the absorber pattern formed on the membrane is not damaged because only the etched surface of the substrate 3 is exposed to the etchant 1. This arrangement can also prevent damage or irreversible deformation of the membrane during the etching process, which is often caused in the conventional techniques.

The partition 13 is a hollow hexagonal cylinder consisting of six partition planes (e.g., side walls) 13a. Each partition plane 13a has an opening K, and a substrate 3 to be etched, which is larger than the opening K in size, is held against the partition plane 13a by the holder 14 so as to close the opening K.

Thus, in this embodiment, six substrates 3 can be etched at a time and, consequently, productivity of the apparatus for manufacturing membrane optical devices can be greatly improved.

The etching apparatus also has outlet valves 41 and 42 for draining the echant 1 and the non-etchant 2 from the tanks 11 and 12 at the same time, while retaining the six substrates 3 on the openings (K).

The valves 41 and 42 are also used to keep the surface levels of the two solutions substantially equal.

In order to facilitate the adjustment of the surface levels of the two solutions, the etching apparatus is designed so that the horizontal cross-sectional areas of the first and second tanks 11 and 12 are substantially equal.

Anti-volatile films or buoys may be placed on the surfaces of the echant 1 and the non-etchant 2 so that the surface levels of the two solutions are kept equal.

A heater (not shown) is provided to heat the etchant 1 and the non-etchant 2 contained in the first and second tanks 11 and 12, respectively.

Now, an example of manufacturing process for fabricating six zone plates using the etching apparatus of this embodiment will be explained.

First of all, six substrates are prepared. The top surface of each substrate is covered with a membrane material layer, while the bottom surface of each substrate is covered with an etching-mask layer. An etching stopper layer may be inserted between the membrane material layer and the top surface of each substrate.

Second, an aperture is formed in the etching-mask layer of each substrate at a position corresponding to the membrane.

Third, a light absorbing pattern layer or an optical filtering layer is formed on the membrane material layer of each substrate. At this point, the substrates are ready to be etched.

Fourth, the six substrates to be etched are secured by six holders 14 so that the aperture of the etching mask layer of each substrate faces the first tank 11 and that the absorber pattern layer (or the optical filtering layer) faces the second tank 12. The openings (K) of the partition 13 are now closed by the substrates to be etched, and the first and second tanks 11 and 12 are completely separated.

Finally, an etchant 1 is poured into the first tank 11, while non-etchant 2 is poured into the second tank 12. The six substrates are etched from their apertures of the etching-mask layers at a time until the bottom surfaces of the membranes or the etching stopper layers, if there are, are exposed. Since the substrates are etched mainly in the height direction, while they are hardly etched in the direction parallel to the top surface, the membranes are formed at positions corresponding to the apertures of the etching-mask layers.

Each of these steps will be explained in more detail with reference to FIGS. 6, 3 and 4.

In the first step, a silicon nitride (SiNx) film having a thickness of 0.1 mm is formed on the top and bottom surfaces of each of the six silicon substrates 31 (with a size of 2-inch$^2$ and a thickness of 400 mm) by a low-pressure chemical vapor deposition (LPCVD) method. The top silicon nitride film is referred to as the membrane material layer 32' (which also serves as the etching stopper layer), and the bottom silicon nitride film is referred to as the etching-mask layer 35'.

The silicon nitride film is formed using a TOYO Lindbergh LPCVD system MODEL270 M100, under the conditions of $SiH_2Cl_2$ flow of 75 sccm, $NH_3$ flow of 11 sccm, and the gas temperature of 800° C. The top silicon nitride film ends up the membrane 32 and the bottom silicon nitride film 35' is used as the etching mask 35.

In this step, boron-doped layers may be formed on both surfaces of the substrate 31, instead of the silicon nitride layers, because the boron-doped layer in which $B^+$ is doped into the silicon substrate by ion implantation or thermal diffusion, is hardly etched by the etchant.

For example, if $B^+$ is doped into the silicon substrate by ion implantation at 200 KeV, the boron ions are implanted up to a depth of 0.3 mm from the surface of the silicon substrate 31 and, as a result, a boron-doped layer having an great extent of anti-etching property can be formed.

In the second step, an aperture 34 is formed at a predetermined position in the bottom silicon nitride film 35' of each substrate 31 by a photo-litho method.

Prior to forming the aperture 34, a resist pattern of the aperture 34 is formed on the bottom silicon nitride film 35', and the aperture pattern is transferred onto the silicon nitride film 35' by an RIE method.

In the RIE method, etching is performed for three minutes using 20 sccm $CF_4$ gas and 2 sccm of $O_2$ gas as the etching gases, under the conditions of the gas pressure of 5 Pa and the Rf output of 100 W.

The material of the silicon etching mask is not limited to the SiNx film. Many other materials, including SiOx and SiNO, can be used as long as the material is anti-corrosive to the silicon etchant and suitable to pattern formation.

In the third step, a metal layer 33 having a thickness of 0.2 mm is formed on the top silicon nitride film 32' of each substrate 31. The metal layer 33 is used as the X-ray absorber. In order to hold the X-ray absorber firmly, a titanium film having a thickness of about 50 Å may be formed between the top silicon nitride film 32' and the metal layer 33. In the embodiment, gold is used as the material of the X-ray absorber.

The titanium film and the gold film are formed by magnetron sputtering in the Ar gas atmosphere. Titanium is sputtered for one minute under the Ar gas pressure of 0.9 Pa, and Gold is sputtered for five minutes under the Ar gas pressure of 1 Pa. Before these films are actually formed, presputtering is performed for two minutes for each film under the same condition as the actual sputtering.

Many kinds of metals, including tantalum, chromium, nickel and these alloys, can be used as the X-ray absorber as long as they have high absorbances to rays having a wavelength in use and suitable to micropatterning.

In this embodiment, the metal film 33, as the material of the soft X-ray absorber, is micropatterned to form a large-aperture zone plate pattern 33'.

In the micropatterning, a resist is applied to the metal film 33 of each substrate 31 and, then the zone plate pattern, which consists of a number of concentric circles, is printed on the resist by a photo-litho method. The innermost diameter of the pattern is 32.7 mm, the number of zones (circles) is 4,300, the diameter of the zone plate is 4.3 mm, and the wavelength in use is 4 nm.

As a result of the printing of the pattern, the resist remains inside the innermost circle (r1) and outside the outline of the zone plate pattern. L&S is formed from the innermost circle toward the outer circumference.

Using this resist pattern as a mask, the pattern is transferred to the metal layer 33 by ion beam etching using EIR-200ER manufactured by Elionics Inc.

In EIR-200ER, argon gas is ionized with application of an acceleration voltage of 700V. After the pattern transfer, the remaining resist pattern which was used as the etching mask is removed from each substrate 31 by oxygen ashing, whereby six substrate 3, which are to be etched in the etching tank 11, are completed.

In the fourth and the fifth steps, the six substrates (i.e., the zone plate sample) 3 are placed in the etching apparatus as shown in FIG. 6. The silicon substrates 31 are etched form their apertures 34 of the etching-mask films 35' until the membranes 32 are exposed.

Before the six zone plate samples 3 are fixed to the etching apparatus, each of the completed substrates 3 having the X-ray absorber patterns thereon is cut into a 30 mm square sample. These zone plate samples 3 are retained by the holders 14 so that the aperture 34 of the bottom silicon nitride film (i.e., the etching-mask film) 35 of each sample 3 faces the first tank 11 and that the zone plate pattern (i.e., the X-ray absorber pattern) 33' of each sample 3 faces the second tank 12. In this state, the openings (K) of the partition planes 13a are closed by the zone plate samples 3.

In this embodiment, the opening (K) of each partition plane 13a is set to φ8 mm according to the dimensions of the zone plate sample 3 and the X-ray absorber pattern 33'.

The partition planes 13a are secured to the main body of the etching apparatus through sealing member (e.g., an O ring) 15. Another sealing members (O rings) are provided between each of the partition planes 13a and the zone plate sample 3 and between each of the holders 14 and the zone plate sample 3, so that the etchant 1 and the non-etchant 2 would not mix.

The etchant 1 is poured into the first tank 11 from the inlet valve 41, while the non-etchant 2 is poured into the second tank 12 from the inlet valve 42. The silicon substrate 31 of each sample 3 is etched from the aperture 34 of the silicon nitride film 35. The silicon nitride film 35 is used as an etching mask, and the substrate 31 is only exposed to the etchant 1 through the aperture 34. The substrate 31 is etched until the membrane 32 is exposed.

In particular, 40 weight percent saccharose solution is used as the non-etchant 2, and 40 weight percent potassium hydride solution is used as the etchant 1. These solutions are poured until the etching surfaces of the six zone plate samples 3 are completely immersed in the etchant 1. At the same time, these solutions are controlled so that the surface levels of the two solutions are always kept equal.

The specific gravity of the saccharose solution is set to equal to that of the potassium hydride solution. As a solvent of the saccharose solution, water is preferably used because of its easiness to treat, operativity and safety. However, it is not limited to the water.

In general, the solutions contained in the first and second tanks 11 and 12 are heated up to about 85° C. during the etching process. Accordingly, the solutions are easily vaporized. Since the vaporization rate differs among solvents, the solvent of the etchant 1 may be used as the solvent of the non-etchant (i.e., anti-corrosive solution) 2 in order to keep the surface levels of the two solutions substantially equal.

Since the solutions in the tanks 11 and 12 are heated, inflammable solvents must be carefully treated.

In order to keep the surface level of the echant 1 and the non-etchant 2 in the first and second tanks 11 and 12, the etching apparatus is designed so that the horizontal cross-sectional areas of the tanks 11 and 12 are substantially equal. It is also efficient for keeping the surface levels equal to place anti-vaporization films or buoys on the liquid surfaces of the tanks 11 and 12.

Examples of the substances added to the non-etchant 2 for the purpose of adjusting the specific gravity of the non-etchant includes saccharose, cane sugar, etc., salt (sodium chloride), urea, and any other substances that dissolve in the solvent and that do not corrode or peel off the micropatterned absorbing film or filtering film formed on the membrane.

The range of the specific gravity of the non-etchant 2 depends on the mechanical strength (determined by the property of the material, the thickness, and the area size) of the membrane which is to be formed through the etching process. As the mechanical strength of the membrane decreases, the specific gravity of the non-etchant 2 contained in the second tank 12 must approach the specific gravity of the etchant 1 in the first tank 11.

For example, if a membrane having a thickness of 0.1 mm and a diameter of 35 mm is to be made of $SiN_x$ (x=0.33), and if potassium hydride solution of 40 weight percent is used as the etchant 1, the concentration of saccharose solution (e.g., the non-etchant 2) in the second tank 12 must be between 35 weight percent and 40 weight percent in order to form a satisfactory membrane according to the experiment.

In other words, the membrane was satisfactorily formed when the ratio of the specific gravity of the non-etchant 2 to the specific gravity of the etchant 1 was set from 87.5% to 112.5%.

However, if the membrane size increases, the acceptable range of the ratio of the specific gravities of the two solutions must be narrowed. For example, when forming a membrane having a diameter of 40 mm, a satisfactory membrane cannot be obtained unless the ratio is not less than 91% and not more than 109%. These ranges were measured under the condition that the surface levels of the two solutions were kept at a substantially equal level.

The etching speed of the silicon substrate greatly depends on the temperature of the reacting portion. In order to achieve the etching speed of 1 mm/min or faster, the temperature of the reacting portion must be 75° C. or higher.

In this embodiment, the entirety of the etching tank is heated directly or indirectly, and the temperature of the etchant 1 was kept at 85° C. Under this condition, the etching speed was 1.4 mm/min and the silicon substrate having a thickness of 400 mm was completely etched, that is, a membrane made of silicon nitride is obtained in 5 hours.

Completion of etching was confirmed at a point of time when the zone plate pattern on the membrane was seen through the membrane from the etching side and no more continuous bubbles were generated from the reacting surface.

In order to observe the progress of silicon etching, the etching tank is preferably made of a transparent material, or designed partially transparent so as to allow observation from the outside of the etching apparatus.

The reaction of the silicon etching is expressed by formula (1).

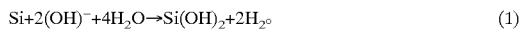

$$Si + 2(OH)^- + 4H_2O \rightarrow Si(OH)_2 + 2H_2\circ \qquad (1)$$

The bubble generated from the reaction surface is considered as active hydrogen and, accordingly, it is preferable to equip a ventilation system or an exhauster system to perform the etching safely and hygienically.

When silicon etching has been completed, the zone plate sample 3 is taken out of the etching apparatus. Since a thin membrane is formed in the zone plate sample 3, it must be treated carefully so that no large stress is applied to the membrane; otherwise the membrane would break or deform. In the embodiment, the etchant 1 and the non-etchant 2 are drained from the first and second tanks 11 and 12 simultaneously through the outlet valves 41 and 42, while the six zone plate samples 3 are still held by the holders 14. The outlet amount of the etchant 1 and the non-etchant 2 are controlled by adjusting the valves 41 and 42 so that their surface levels are kept equal, whereby undesirable stress or pressure is prevented from being applied to the membrane.

A pump may be used in place of or together with the valves 41 and 42 to drain the solutions from the tanks 11 and 12.

Alternatively, if the solutions are not drained from the tanks 11 and 12, a stretch mechanism 23 for placing and removing the zone plate samples 3 held by the holders 14 against the openings (K) into and from the etching apparatus is used. (See FIG. 8.) With this stretch mechanism 23, the six zone plate samples 3 are placed and removed vertically in such a mainer that the pattern surfaces of the samples 3 would never touch the etchant 1 and that the etchant 1 and the non-etchant 2 would not mix with each other.

The stretch mechanism 23 is provided to each of the partition planes 13a, and vertically elongates and shortens, while supporting the partition plane 13a. Each partition plane 13a and the stretch mechanism 23 are sealed by the O ring 15. In addition, each of the zone plate samples 3 is held by the associated holder 14 and sealed by another O ring 15 so that the opening (K) is completely closed by the zone plate sample 3. Consequently, the etchant 1 and the non-etchant 2 are prevented from mixing with each other regardless of the vertical position of the zone plate sample 3.

Since the pressures of the etchant 1 and the non-etchant 2 are kept substantially equal, no undesirable stress is applied to the membranes when the zone plate samples 3 are removed from the etching apparatus upward.

If the zone plate samples 3 and the partition planes 13a are simply removed from the etching apparatus without using the stretch mechanism 23, the etchant 1 abruptly mixes into the non-etchant 2 immediately after any of the partition planes 13a are separated from the o rings 15, which may causes the zone plate patterns 33 to peel off from the membranes 32.

After the six zone plate samples 3 are taken out of the etching apparatus, they are well rinsed by water or warm water and dried. The zone plate samples 3 are rinsed so that no large stress that may cause deformation or breakage is applied to the membranes.

The method and the apparatus according to this embodiment can efficiently prevent irreversible deformation or breakage of the membrane, which was a serious problem in the conventional techniques when fabricating a zone plate. In addition, damage or peeling of the absorber pattern can also be prevent.

Fifth Embodiment

In the fifth embodiment, three transmissive optical devices, each having a plain membrane, and three transmissive optical devices, each having a membrane in which a micropattern is formed, are fabricated at a time using the etching apparatus of the fourth embodiment according to the same process. The membrane material layer of each device is formed as a boron-doped layer of the silicon substrate.

In forming the base materials of the transmissive optical devices with plain membranes, three 8-inch substrates were prepared. A boron-doped layer is formed on each of the 8-inch substrates by doping $B^+$ into the top surface of the silicon substrate by ion implantation at 200 KeV. The boron ions are implanted up to a depth of 0.3 mm from the surface of each silicon substrate 31. This boron-doped layer is used as the membrane material layer.

Then, a SiNx layer is formed up to a thickness of 0.1 mm on either surface of each substrate by a low-pressure chemical vapor deposition (LPCVD) method under the conditions of $SiH_2Cl_2$ flow of 75 sccm, $NH_3$ flow of 11 sccm, and the gas temperature of 900° C. The SiNx film formed on the $B^+$ dope layer is removed in the later step, while the SiNx layer formed on the bottom surface of the substrate is patterned and used as the mask during the silicon etching process.

The SiNx layer on the boron-doped layer is removed by dry etching using 20 sccm $CF_4$ gas and 2 sccm $O_2$ gas as the reacting gases. The dry etching is performed for five minutes under the conditions of a gas pressure of 20 Pa and an Rf output of 50 W.

On the other hand, a resist is applied onto the SiNx layer on the bottom surface of the substrate, and a resist pattern is formed by an aligner. In particular, the resist film is exposed and developed into a desired resist pattern so that the resist film remains at positions where the silicon substrate would not be etched. Prebake or postbake may be performed before or after the exposure process if necessary.

The resist pattern is transferred onto the SiNx layer by dry etching using the resist pattern as a mask. The dry etching was performed for three minutes under the conditions of a gas pressure of 5 Pa of the reacting gas (20 sccm $CF_4$ gas plus 2 sccm $O_2$ gas) and an Rf output of 100 W. Through this process, exposed portion of the SiNx layer was completely etched, while the SiNx layer covered by the resist remained.

Finally, the remaining resist is removed by dry etching using 50 sccm of $O_2$ gas as a reacting gas under the conditions of a gas pressure of about 30 Pa, an Rf output of 50 W, and an etching time of thirty minutes. Thus, three base materials which are to be etched for producing transmissive optical devices with plain membrane are completed.

If a micropattern is formed on the boron-doped layer (i.e., the membrane material layer) on the top surface of each substrate in advance, then transmissive optical devices having micropatterned membranes are obtained after the back etching of the substrates. Many types of membranes having micropatterns, such as an exposure mask pattern for electron beams, an exposure mask pattern for X-rays, or the like, can be fabricated by patterning the boron-doped layer in advance.

Next, another three base materials are prepared for transmissive optical devices having membranes in which micropatterns are formed.

In each of the base materials, a Cr film having a thickness of 0.1 mm is formed on the membrane material layer (i.e., boron-doped layer) on the substrate by an EB deposition method.

Then, electron beam resist PMMA (OBBR1000 manufactured by TOKYO OUKA) is applied onto the Cr film up to a thickness of 0.30 mm. The resist layer is printed by an EB printing method, and developed into a desired pattern. This resist pattern is used as a mask to transfer the pattern to the Cr film by an RIE method.

In the RIE process, $CCL_4$, $O_2$, and Ar are mixed at a mixing ratio of 2:2:3, and this mixed gas is used as the reacting gas under a gas pressure of 20 Pa.

After the resist pattern has been transferred onto the Cr film, the resist pattern is removed by MEK (Methyl ethyl ketone). At this point, three base materials for transmissive optical devices with micropatterned membranes are completed.

The three base materials for optical devices with plain membranes and the three base material for optical devices with micropatterned membranes are placed in the etching apparatus of the first embodiment, and etched until the membranes are formed. After the etching, the six devices are rinsed with water and naturally dried.

According to this method, six optical devices with membranes are produced at a time without a damage or breakage of the membranes. Especially different types of devices can be manufactured in the same etching apparatus. Thus, the productivity of the apparatus and the quality of the resultant devices are improved.

Sixth Embodiment

Figure 7:
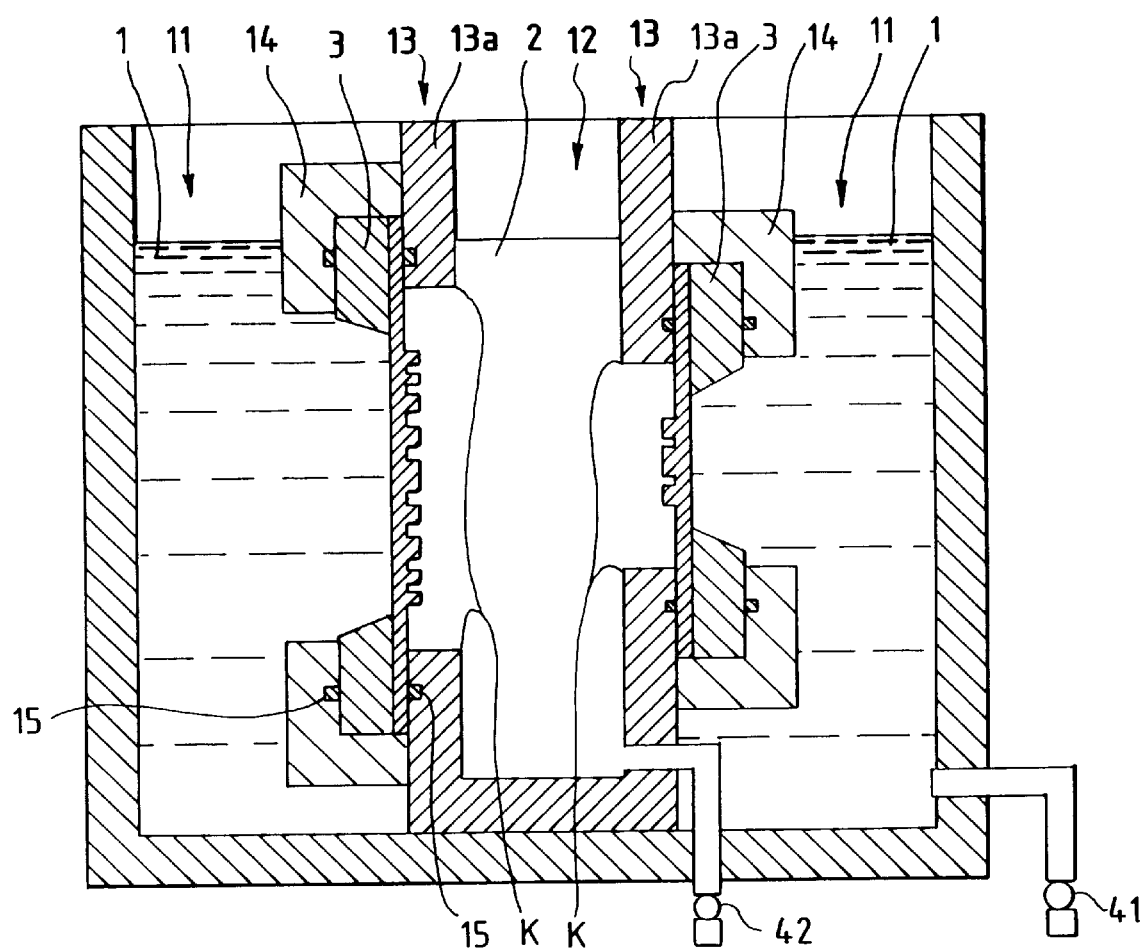
FIG. 7 is a vertical cross-sectional view showing a part of the etching apparatus according to the sixth embodiment.

FIG. 7 is a vertical cross-sectional view of the etching apparatus according to the third embodiment of the invention.

The partition 13 of this embodiment also consists of six partition planes 13a, as in the fourth embodiment. However, in this embodiment, different sizes of openings K are formed in the partition planes 13a. More specifically, openings K' of φ8 mm are formed in three partition planes 13a, while openings K of φ23 mm are formed in other three partition planes 13a.

From the base materials (i.e., the substrates) which are held against the openings K' of 8 mm, three zone plates are formed through the etching process. At the same time, three optical filters for an X-ray microscope are formed from the base material (i.e., the substrate) which are held against the openings K of 23 mm, through the same etching process.

In this manner, the partition 13 placed between the first tank 11 and the second tank 12 can hold a plurality of different sizes and/or shapes of substrates 3, which are etched into different types of device in the same etching process using the same etching apparatus.

With this etching apparatus, the productivity of the apparatus for manufacturing optical devices with membranes is greatly improved, while preventing irreversible deformation or breakage of the membranes during the etching process, which was a serious problem in the prior art techniques.

As has been described above, since it is not necessary to newly design the tank or the etching apparatus itself for a novel etching object, the time and the cost required to set up the apparatus are eliminated and, as a result, the productivity of the apparatus for various types of optical devices with membranes is improved.

In addition, because the substrates to be etched are held in the etching apparatus so that the pressures on both sides of the substrates are kept substantially equal during the etching process, deformation or breakage of the membrane can be prevented. This is one of the big advantages over the conventional techniques.

Furthermore, various type of X-ray transmissible devices, on which minute patterns or thin films are formed, can be produced. With this etching apparatus, the thickness of the membrane of an X-ray transmissible device can be reduced to one tenth of the conventional membrane, and a minute absorber pattern or optical filtering pattern was reliably formed and maintained on such a thin membrane.

In general, the ultimate strength of the membrane is in inverse proportional to square of the thickness. Accordingly, with one tenth of thickness, the ultimate strength of the membrane becomes $\frac{1}{100}$. The etching apparatus of the present invention can produce optical devices having such a thin membrane through the etching process at a high productivity, without damaging the membrane.

Because a transmissible optical device having a very thin membrane can be achieved, the etching apparatus of the present invention also contributes to increasing the freedom of design in many optical devices, such as X-ray microscopes.

While the invention has been described by way of exemplary embodiments, it is understood that there are many changes and substitutions without departing from the scope of the invention, which is defined by the appended claims.

I claim:

1. An etching apparatus comprising:

a first tank for containing an etchant;

a second tank for containing a non-etchant;

a vertical partition positioned between the first tank and the second tank to separate the first and second tanks in the etching apparatus, said partition having at least one opening;

at least one holder for holding at least one substrate to be etched against the vertical partition so that the at least one opening of the vertical partition is closed by the at least one substrate, the at least one substrate being larger than the at least one opening in size and having a first surface and an opposite etching surface, the at least one holder holding the at least one substrate so that the etching surface of the at least one substrate is exposed to the etchant contained in the first tank through the at least one opening without touching the non-etchant and that the first surface of the at least one substrate is exposed to the non-etchant contained in the second tank without touching the etchant;

an inlet/outlet mechanism for supplying the etchant and the non-etchant to the first tank and the second tank simultaneously and draining the etchant and the non-etchant from the first tank and the second tank simultaneously; and a control mechanism for keeping the surface levels of the etchant and the non-etchant substantially equal to keep the pressures of said etchant and said non-etchant on the substrate substantially equal.

2. The etching apparatus according to claim 1, further comprising a mechanism for placing and removing the at least one substrate which is held by the at least one holder against the at least one opening of the vertical partition in and from a position of the etching apparatus, while preventing the first surface of the at least one substrate from touching the etchant and preventing the etchant and the non-etchant from mixing with each other in the etching apparatus.

3. The etching apparatus according to claim 2, wherein the mechanism is a stretch mechanism for placing and removing for moving the partition vertically.

4. The etching apparatus according to claim 2, wherein the mechanism is a driving mechanism for placing and removing for moving the partition vertically.

5. The etching apparatus according to claim 2, wherein the vertical partition separates the etchant and the non-etchant with help of a sealing member, and when the at least one opening is positioned between the first tank and the second tank in the etching apparatus, the at least one substrate held against the at least one opening in the partition prevents the etchant and the non-etchant from mixing with each other.

6. The etching apparatus according to claim 5, wherein the ratio of specific gravity of the non-etchant to specific gravity of the etchant is set in the range from 0.85 to 1.15, and the ratio of the distance from the center of the substrate to the surface of non-etchant to the distance from the center of the substrate to the surface of the etchant is set to the range from 0.9 to 1.1.

7. The etching apparatus according to claim 5, wherein the at least one opening in the vertical partition is adjustable in size and/or shape, and the vertical partition has a mechanism for changing or adjusting the size and/or the shape of the at least one opening.

8. The etching apparatus according to claim 5, wherein the vertical partition is interchangeable with another vertical partition having an opening of different size and/or shape in accordance with the at least one substrate to be treated.

9. The etching apparatus according to claim 5, wherein the vertical partition comprises a base wall, and an auxiliary board with at least one opening, the auxiliary board being fixed to the base wall and interchangeable with another auxiliary board having at least one opening of different size and/or shape in accordance with the at least one substrate to be treated.

10. The etching apparatus according to claim 5, wherein the partition comprises a base wall and an auxiliary board with at least one opening adjustable in size and/or shape in accordance with the at least one substrate to be treated, the board being fixed to the base wall.

11. An etching apparatus comprising:
a first tank for containing an etchant;
a second tank for containing a non-etchant; and
a partition consisting of a plurality of vertical planes, each plane having at least one opening, said planes positioned between the first tank and the second tank to separate the first and second tanks in the etching apparatus, each vertical plane having at least one holder for holding at least one substrate to be etched against said plane so that the openings of the planes are closed by the substrates, said substrates being larger in size than said openings and each having a first surface and an opposite etching surface, the holders are holding the substrates so that the etching surfaces of the substrates are exposed to the etchant contained in the first tank through respective openings without touching the non-etchant, and that the first surfaces of the substrates are exposed to the non-etchant contained in the second tank without touching the etchant.

12. The etching apparatus according to claim 11, further comprising a mechanism for placing and removing the substrates which are held by the holders against the openings of the partition in and from a position of the etching apparatus, while preventing the first surfaces of the substrates from touching the etchant and preventing the etchant and the non-etchant from mixing with each other in the etching apparatus.

13. The etching apparatus according to claim 12, wherein when the openings of the partition are positioned between the first tank and the second tank in the etching apparatus, the partition and the substrates held against the openings prevent the etchant and the non-etchant from mixing with each other with help of a sealing member, and when the openings are positioned out of the etching apparatus, the partition planes separates the etchant and the non-etchant with help of the sealing member.

14. The etching apparatus according to claim 13, further comprising an inlet/outlet mechanism for supplying the etchant and the non-etchant to the first tank and the second tank simultaneously and draining the etchant and the non-etchant from the first tank and the second tank simultaneously.

15. The etching apparatus according to claim 14, further comprising a control mechanism for keeping the surface levels of the etchant and the non-etchant substantially equal to keep the pressures of the etchant and the non-etchant on the substrates substantially equal.

16. The etching process according to claim 15, wherein the ratio of the specific gravity of the non-echant to the specific gravity of the etchant is set to the range from 0.85 to 1.15, and the ratio of the distance from the center of the substrate to the surface of non-etchant to the distance from the center of the substrate to the surface of the etchant is set to the range from 0.9 to 1.1.

17. An etching apparatus comprising:
a first tank for containing an etchant;
a second tank for containing a non-etchant; and
a partition positioned between the first tank and the second tank to separate the first and second tanks in the etching apparatus, said partition having a plurality of openings of different size and shape;
a plurality of holders for holding a plurality of substrates to be etched against said partition so that the openings of the partition being closed by said substrates, the substrates being larger than respective openings in size, each substrate having a first surface and an opposite etching surface, each holder holding the substrate so that the etching surface of the substrate is exposed to the etchant contained in the first tank through respective openings without touching the non-etchant and that the first surface of each substrate is exposed to the non-etchant contained in the second tank without touching the etchant;
a mechanism for placing and removing the substrates which are held by the holders against the openings of the partition in and from a position of the etching apparatus, while preventing the first surfaces of the substrates from touching the etchant and preventing the etchant and the non-etchant from mixing with each other in the etching apparatus;
an inlet/outlet mechanism for supplying the etchant and the non-etchant to the first tank and the second tank simultaneously and draining the etchant and the non-etchant from the first tank and the second tank simultaneously; and
a control mechanism for keeping the surface levels of the etchant and the non-etchant substantially equal to keep the pressures of said etchant and said non-etchant on the substrate substantially equal.

18. The etching apparatus of claim 17, wherein the ratio of specific gravity of the non-etchant to specific gravity of the etchant is set in the range from 0.85 to 1.15, and the ratio of the distance from the center of the substrate to the surface of non-etchant to the distance from the center of the substrate to the surface of the etchant is set to the range from 0.9 to 1.1.

* * * * *